(12) United States Patent
Hu et al.

(10) Patent No.: US 11,217,502 B2
(45) Date of Patent: Jan. 4, 2022

(54) SEMICONDUCTOR DEVICE PACKAGES AND METHODS OF MANUFACTURING THE SAME

(71) Applicant: Advanced Semiconductor Engineering, Inc., Kaohsiung (TW)

(72) Inventors: Ian Hu, Kaohsiung (TW); Meng-Kai Shih, Kaohsiung (TW); Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 21 days.

(21) Appl. No.: 16/676,284

(22) Filed: Nov. 6, 2019

(65) Prior Publication Data

US 2021/0134696 A1  May 6, 2021

(51) Int. Cl.
*H01L 23/367* (2006.01)
*H01L 23/13* (2006.01)
*H01L 23/00* (2006.01)
*H01L 23/427* (2006.01)

(52) U.S. Cl.
CPC ............ *H01L 23/367* (2013.01); *H01L 23/13* (2013.01); *H01L 23/427* (2013.01); *H01L 24/29* (2013.01); *H01L 2224/2919* (2013.01)

(58) Field of Classification Search
CPC .............................. H01L 23/36; H01L 23/367
See application file for complete search history.

(56) References Cited

U.S. PATENT DOCUMENTS

| 7,119,433 | B2 | 10/2006 | Corbin, Jr. et al. |
| 10,319,665 | B2 | 6/2019 | Maruyama |
| 2020/0152546 | A1* | 5/2020 | Refai-Ahmed ....... H01L 23/481 |

\* cited by examiner

*Primary Examiner* — Yu-Hsi D Sun
(74) *Attorney, Agent, or Firm* — Foley & Lardner LLP (57) ABSTRACT

A semiconductor device package includes a substrate, an electronic component disposed on the substrate, a supporting structure disposed on the substrate and surrounding the electronic component, and a heat spreading structure disposed on the supporting structure. A length of the supporting structure and a length of the heat spreading structure are greater than a length of the substrate.

18 Claims, 11 Drawing Sheets

SEMICONDUCTOR DEVICE PACKAGES AND METHODS OF MANUFACTURING THE SAME

BACKGROUND

1. Field of the Disclosure

The present disclosure relates to semiconductor device packages and methods of manufacturing the same.

2. Description of Related Art

A semiconductor device package may include some semiconductor devices stacked atop one another. However, as the functionality of the semiconductor device improves, more heat may be generated. The overall device package should have a large heat dispersion area to achieve more efficient heat dissipation. Although increasing the size of the device package contributes to heat dissipation, it will inevitably increase the cost of the process and sacrifice the PCB area usage.

SUMMARY

According to some example embodiments of the instant disclosure, a semiconductor device package includes a substrate, an electronic component disposed on the substrate, a supporting structure disposed on the substrate and surrounding the electronic component, and a heat spreading structure disposed on the supporting structure. A length of the supporting structure and a length of the heat spreading structure are greater than a length of the substrate.

According to some example embodiments of the instant disclosure, a semiconductor device package includes a substrate, a first electronic component disposed on the substrate, a supporting structure surrounding the first electronic component, and a heat spreading structure covering the first electronic component and the supporting structure. The supporting structure has a first portion over the substrate and a second portion extending laterally beyond a lateral surface of the substrate.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that may be embodied in a wide variety of specific contexts. The specific embodiments discussed are merely illustrative and do not limit the scope of the disclosure.

Figure 1A:
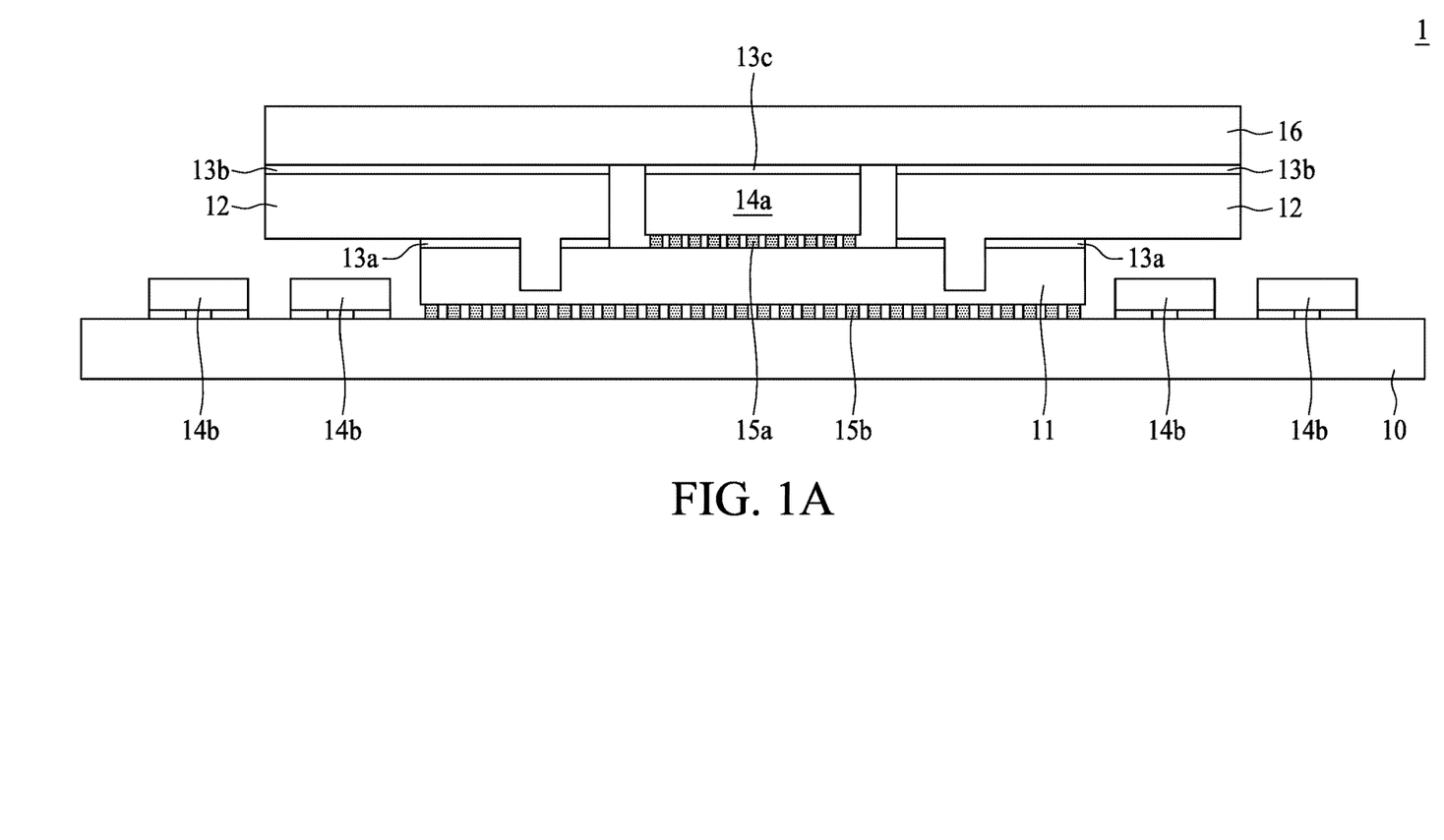
FIG. 1A, FIG. 1B, FIG. 1C, FIG. 1D and FIG. 1E are cross-sectional views of a semiconductor device package in accordance with some embodiments of the present disclosure.

FIG. 1A is a cross-sectional view of a semiconductor device package 1 in accordance with some embodiments of the present disclosure. The semiconductor device package 1 includes a carrier 10, a substrate 11, a supporting structure 12, electronic components 14a and 14b, and a heat spreading structure 16.

The carrier 10 may be, for example, a printed circuit board, such as a paper-based copper foil laminate, a composite copper foil laminate, or a polymer-impregnated glass-fiber-based copper foil laminate. The carrier 10 has an interconnection structure and/or a grounding element.

The substrate 11 is formed or disposed on the carrier 10. The substrate 11 may be connected to the carrier 10 by the electrical contacts 15b. The substrate 11 may be, for example, a printed circuit board, such as a paper-based copper foil laminate, a composite copper foil laminate, or a polymer-impregnated glass-fiber-based copper foil laminate. The substrate 11 may include an interconnection structure, such as a redistribution layer (RDL) or a grounding element.

Each of the electronic components 14a and 14b include a plurality of semiconductor devices, such as, but not limited to, transistors, capacitors and resistors interconnected together by a die interconnection structure into functional circuits to thereby form an integrated circuit. As will be understood to those skilled in the art, the device side of the semiconductor die includes an active portion including integrated circuitry and interconnection. The electronic components 14a and 14b may be any suitable integrated circuit device including, but not limited to, a microprocessor (e.g., single or multi-core), a memory device, a chipset, a graphics device, a high bandwidth memory (HBM), or an application-specific integrated circuit (ASIC) according to several different embodiments.

The electronic component 14a is formed or disposed on the substrate 11. A plurality of electrical contacts 15a are disposed on an active surface of the electronic component 14a to provide electrical connection between the electronic component 14a and the substrate 11. The electronic components 14b are formed or disposed on the carrier 10. The electronic components 14b are disposed adjacent to the substrate 11. Some of the electronic components 14b may be arranged below the supporting structure 12. For example, some of the electronic component 14 are disposed within a projection of the supporting structure 12 on the carrier 10. For example, some of the electronic component 14 are fully covered by the supporting structure 12 from a top view of the semiconductor device package 1.

The supporting structure 12 is disposed on the substrate 11. The supporting structure 12 may be connected to the substrate 11 through an adhesive layer 13a. In some embodiments, the supporting structure 12 laterally extends beyond a lateral surface of the substrate 11. In some embodiments, the supporting structure 12 laterally extends beyond a lateral surface of some of the electronic component 14b. In some embodiments, a portion of the supporting structure 12 extends within the substrate 11 and is in contact with the substrate 11. A portion of the supporting structure 12 is surrounded by or embedded within the substrate 11. A portion of the supporting structure 12 is spaced apart from the substrate 11 by the adhesive layer 13a.

The supporting structure 12 may be or include aluminum (Al), copper (Cu), titanium (Ti), tungsten (W) or other suitable material(s) (e.g., metal, alloy or non-metal conductive material(s)). The supporting structure 12 may also include epoxy resin, a polyimide, a phenolic compound, a silicone dispersed therein, or a combination thereof.

The adhesive layer 13a is formed between the substrate 11 and the supporting structure 12. The supporting structure 12 may be connected to the substrate by utilizing the adhesive layer 13a. In some embodiments, the adhesive layer 13a may include a gel type or film type adhesive layer. The adhesive layer 13a may include a thermoset resin. The adhesive layer 13a may include a thermoplastic resin. The adhesive layer 13a may include one or more of the following: a resin, a polyester resin, a polyether resin, an epoxy resin and/or a polyolefin composition. In some embodiments, the adhesive layer 13a may include a thermal interface material (TIM) or a thermal paste layer.

The heat spreading structure 16 is formed or disposed on the supporting structure 12 and the electronic component 14a. The heat spreading structure 16 may be supported or sustained by the supporting structure 12. The heat spreading structure 16 is thermally connected to the electronic component 14a (e.g., to a backside surface of the electronic component 14a). When heat is generated by the electronic component 14a, the heat dissipation may be achieved by the heat spreading structure 16.

The heat spreading structure 16 may include a heat sink, cold plate, or other suitable cooling means, or a lid, or heat pipe, or another intermediate structure which is in contact with the electronic component 14a. The heat spreading structure 16 is envisioned to be constructed using heat-conducting material including copper and/or aluminum. The heat spreading structure 16 may dissipate heat generated by circuitry present on, for example, the electronic component 14a.

The adhesive layer 13c is disposed between the heat spreading structure 16 and the supporting structure 12. The heat spreading structure 16 may be secured or connected to the supporting structure 12 by utilizing the adhesive layer 13c. Therefore, an efficient heat transfer path may be provided from the electronic component 14a via the adhesive layer 13c to the heat spreading structure 16.

In some embodiments, the adhesive layer 13c may include a gel type or film type adhesive layer, a thermoset resin, or a thermoplastic resin. The adhesive layer 13c may also include one or more of the following: a resin, a polyester resin, a polyether resin, an epoxy resin and/or a polyolefin composition. In some embodiments, the adhesive layer 13c may include a thermal interface material (TIM) or a thermal paste layer.

The adhesive layer 13b is formed between the heat spreading structure 16 and the supporting structure 12. The heat spreading structure 16 may be connected to the supporting structure 12 by utilizing the adhesive layer 13b. In some embodiments, the adhesive layer 13b may include one or more of the following: a resin, a polyester resin, a polyether resin, an epoxy resin and/or a polyolefin composition. In some embodiments, the adhesive layer 13b may include a thermal interface material (TIM) or a thermal paste layer.

In some embodiments, a material of the adhesive layer 13b is the same as a material of the adhesive layer 13a. A material of the adhesive layer 13c is the same as the material of the adhesive layer 13b and the adhesive layer 13a. In other embodiments, a material of the adhesive layer 13c is different from the material of the adhesive layer 13b and the adhesive layer 13a.

Figure 1B:
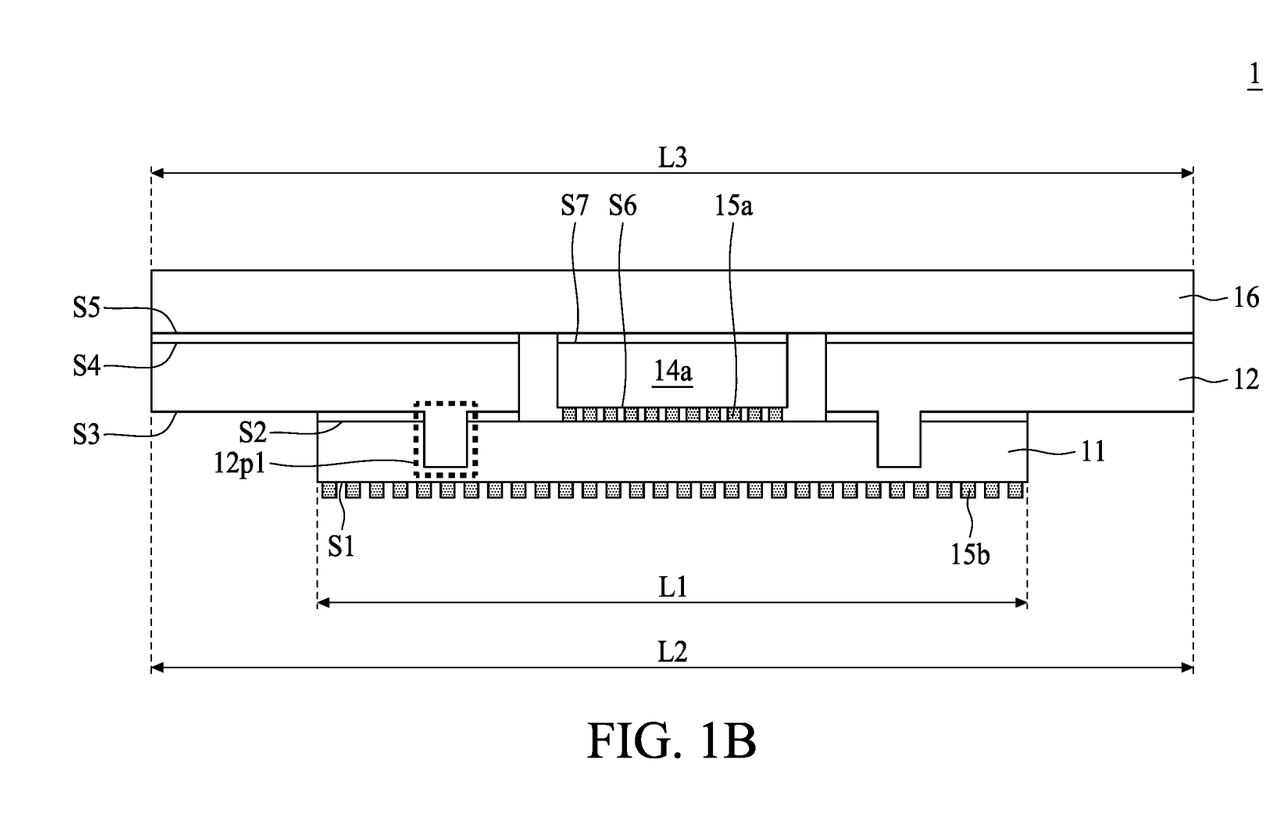

FIG. 1B is a cross-sectional view of a portion of the semiconductor device package 1 in accordance with some embodiments of the present disclosure. In FIG. 1B, the carrier 10 and the electronic components 14b may be omitted. The supporting structure 12 includes a pin portion 12p1. The pin portion 12p1 may have a rectangle or a rectangle-like profile, a round or a round-like profile, a horn or a horn-like profile, or a cone or a cone-like profile.

The pin portion 12p1 extends from a bottom surface S3 of the supporting structure 12 into the substrate 11. The pin portion 12p1 is surrounded by the adhesive layer 13a and covered by the substrate 11. The pin portion 12p1 is in contact with the substrate 11. Since the pin portion 12p1 is extended or stuck into the substrate 11, the sustaining and linkage between the substrate 11 and the supporting structure 12 may be improved.

In some embodiments, a length L2 of the supporting structure 12 is greater than a length L1 of the substrate 11. In some embodiments, a length L3 of the heat spreading structure 16 is greater than a length L1 of the substrate. The length L2 of the supporting structure 12 is substantially the same to the length L3 of the heat spreading structure 16. Therefore, heat resistance may be reduced by arranging the long heat spreading structure 16 with a large heat transference area to achieve efficient heat dissipation.

In some embodiments, the length L3 of the heat spreading structure 16 is smaller than three times of the length L1 of the substrate 11. The length L2 of the supporting structure 12 is smaller than three times of the length L1 of the substrate 11. The above size constraint may prevent the heat spreading structure 16 from dropping or falling.

Figure 1C:
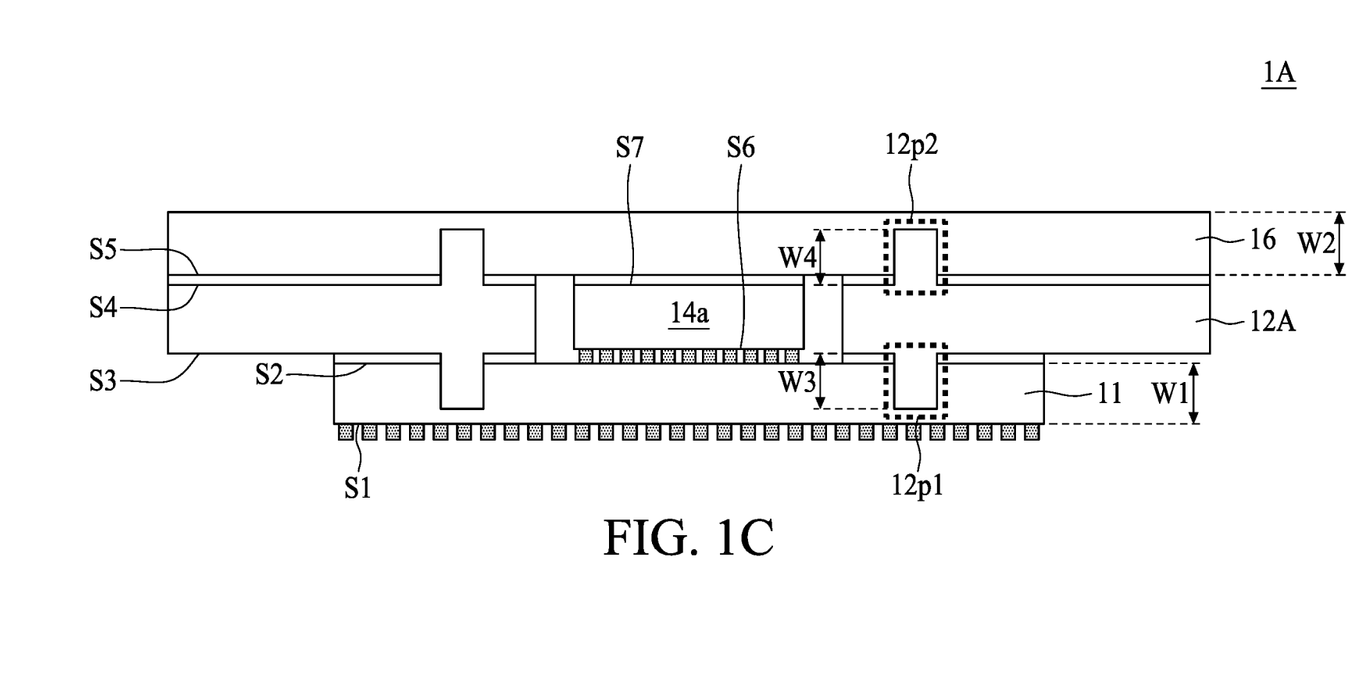

FIG. 1C is a cross-sectional view of the semiconductor device package 1A in accordance with some embodiments of the present disclosure. The semiconductor device package 1A is similar to the semiconductor device package 1, and the differences therebetween are described below.

In some embodiments, the supporting structure 12A laterally extends beyond a lateral surface of the substrate 11. In some embodiments, the supporting structure 12A laterally extends beyond a lateral surface of some of the electronic component 14b. In some embodiments, a portion of the supporting structure 12 extends within the substrate 11 and is in contact with the substrate 11. The supporting structure 12A further includes the pin portion 12p2. The pin portion 12p2 may have a rectangle or a rectangle-like profile, a round or a round-like profile, a horn or a horn-like profile, or a cone or a cone-like profile.

The pin portion 12p2 extends from a top surface S4 of the supporting structure 12 into the heat spreading structure 16. The pin portion 12p2 is surrounded by the adhesive layer 13b and covered by the heat spreading structure 16. The pin portion 12p2 is extended or stuck into the heat spreading structure 16. Therefore, the sustaining and linkage between the heat spreading structure 16 and the supporting structure 12A may be improved by arranging the pin portion 12p2.

A width W4 of the pin portion 12p2 is smaller than a thickness W2 of the heat spreading structure 16. The width W4 of the pin portion 12p2 is greater than half of the thickness W2 of the heat spreading structure 16. For example, the width W4 of the pin portion 12p2 is about 50% to 90% of the thickness W2 of the heat spreading structure 16. A width W3 of the pin portion 12p1 is smaller than a thickness W1 of the substrate 11. The width W3 of the pin portion 12p1 is greater than half of the thickness W1 of the substrate 11. For example, the width W3 of the pin portion 12p1 is about 50% to 90% of the thickness W1 of the substrate 11.

Figure 1D:
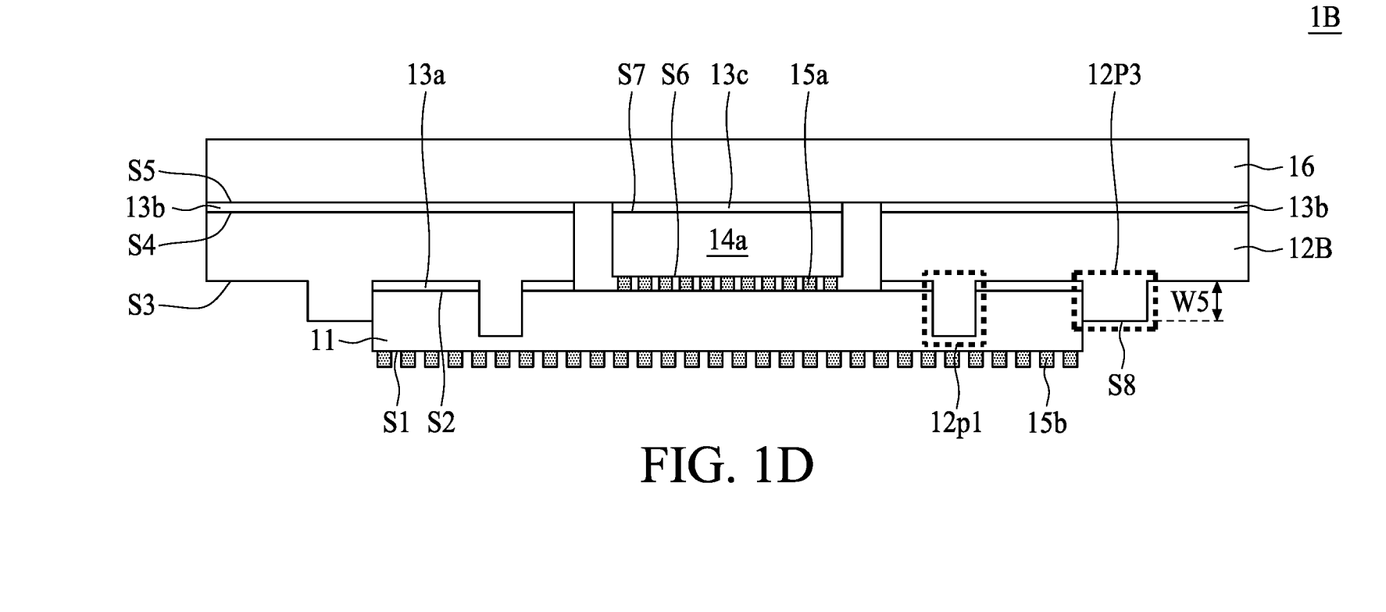

FIG. 1D is another cross-sectional view of the semiconductor device package 1B in accordance with some embodiments of the present disclosure. The semiconductor device package 1B is similar to the semiconductor device package 1, and the differences therebetween are described below.

The supporting structure 12B includes a pin portion 12p3. The pin portion 12p3 is disposed within a projection of the supporting structure 12B. For example, the pin portion 12p3 may be fully covered by the supporting structure 12B from a top view of the semiconductor device package 1B. The pin portion 12p3 may have a rectangle or a rectangle-like profile, a round or a round-like profile, a horn or a horn-like profile, or a cone or a cone-like profile.

The pin portion 12p3 extends from a bottom surface S3 of the supporting structure 12B. The pin portion 12p3 is adjacent to or in direct contact with the lateral surface S8 the substrate 11. A width W5 of the pin portion 12p3 is smaller than a thickness W1 of the substrate 11. The width W5 of the pin portion 12p3 is greater than half of the thickness W1 of the substrate 11. For example, the width W5 of the pin portion 12p3 is about 50% to 90% of the thickness W1 of the substrate 11. The pin portion 12p3 upholds the substrate 11 to improve the sustaining and linkage between the substrate 11 and the supporting structure 12B.

Figure 1E:
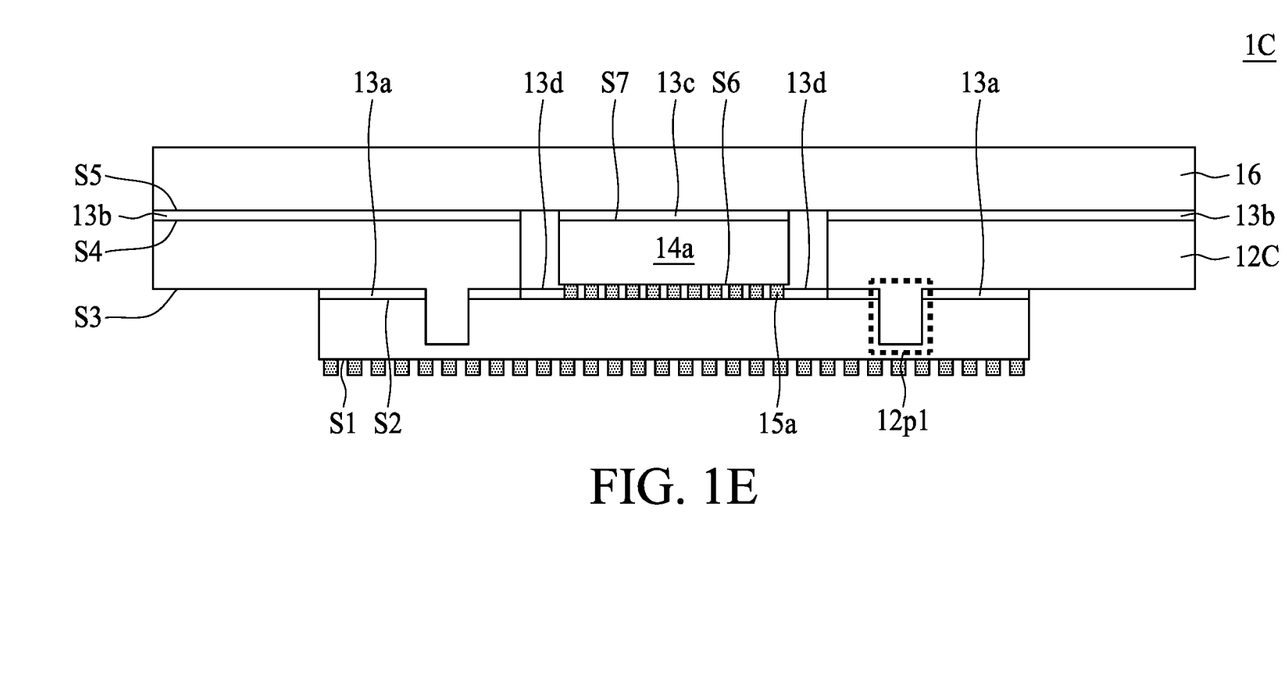

FIG. 1E is another cross-sectional view of the semiconductor device package 1C in accordance with some embodiments of the present disclosure. The semiconductor device package 1B is similar to the semiconductor device package 1, and the differences therebetween are described below. The electronic component 14a is separated apart from the supporting structure 12C. An air gap is formed between the electronic component 14a and the supporting structure 12C to achieve heat spreading.

An adhesive layer 13d is formed or disposed on the substrate 11. The adhesive layer 13d is formed between the electronic component 14a and the supporting structure 12C. The adhesive layer 13d may be in direct contact with the adhesive layer 13a and the electrical contacts 15a. A heat transfer path may be provided accordingly from the electronic component 14a via the electrical contacts 15a to the adhesive layer 13d.

Figure 1F:
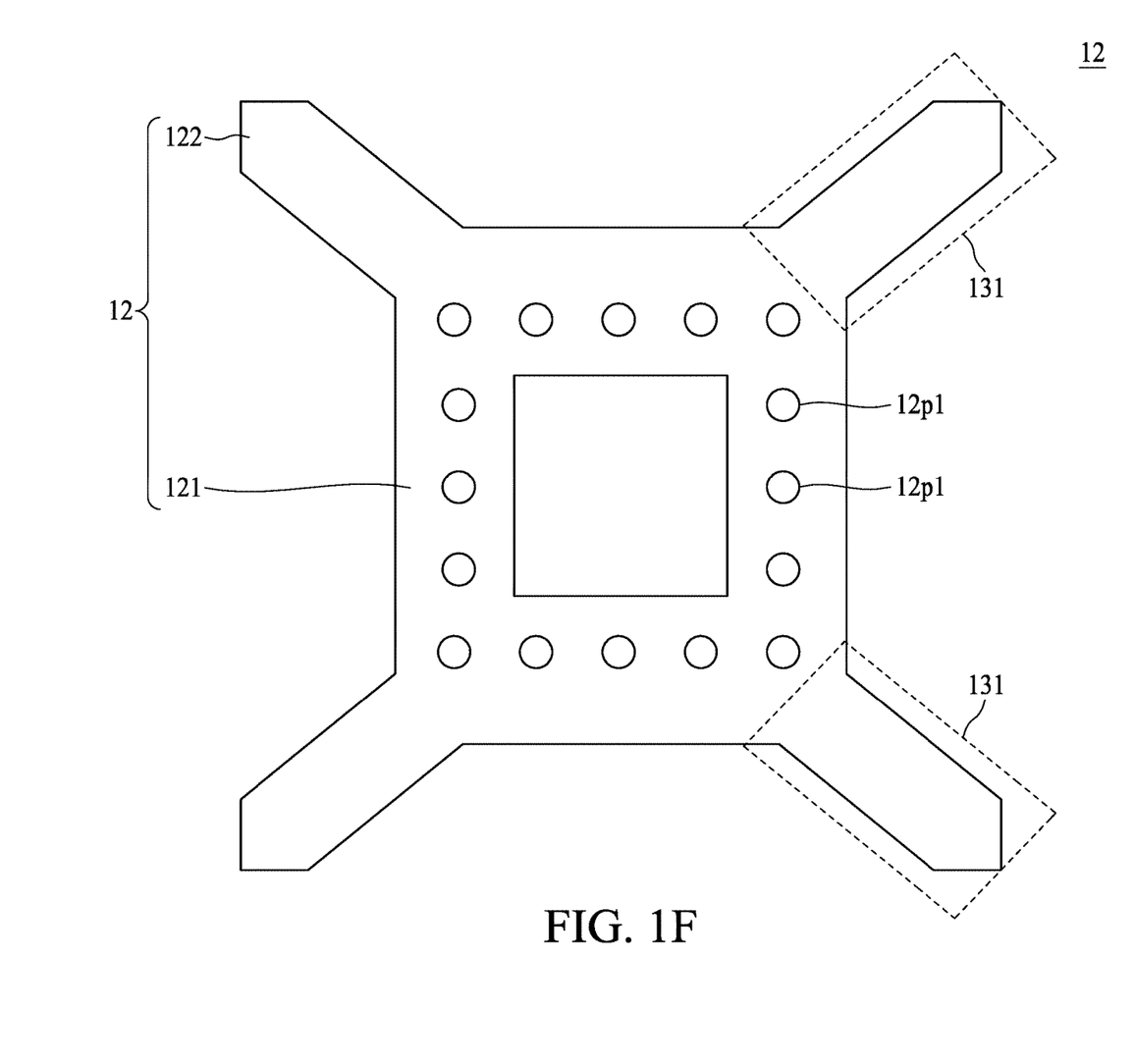
FIG. 1F is a top view of a supporting structure of the semiconductor device package in accordance with some embodiments of the present disclosure.

FIG. 1F is a top view of the supporting structure 12 of the semiconductor device package 1 in accordance with some embodiments of the present disclosure. The supporting structure 12 includes two portions 121 and 122. The portion 121 may have a rectangle or a rectangle-like profile or a square ring. The electronic component 14a may be located at the central region encircled by the portion 121.

The pin portions 12p1 are formed within the portion 121. The positions of the pin portions 12p1 are arranged in a rectangle or a rectangle-like profile. The pin portions 12p1 encircle or surround the electronic component 14a. The portion 122 includes several prolonging portions 131. The prolonging portions 131 extend from four corners of the region 121. A thickness of the portion 121 is substantially the same as a thickness of the portion 122. In other embodiments, A thickness of the portion 121 is greater than a thickness of the portion 122.

Figure 2A:
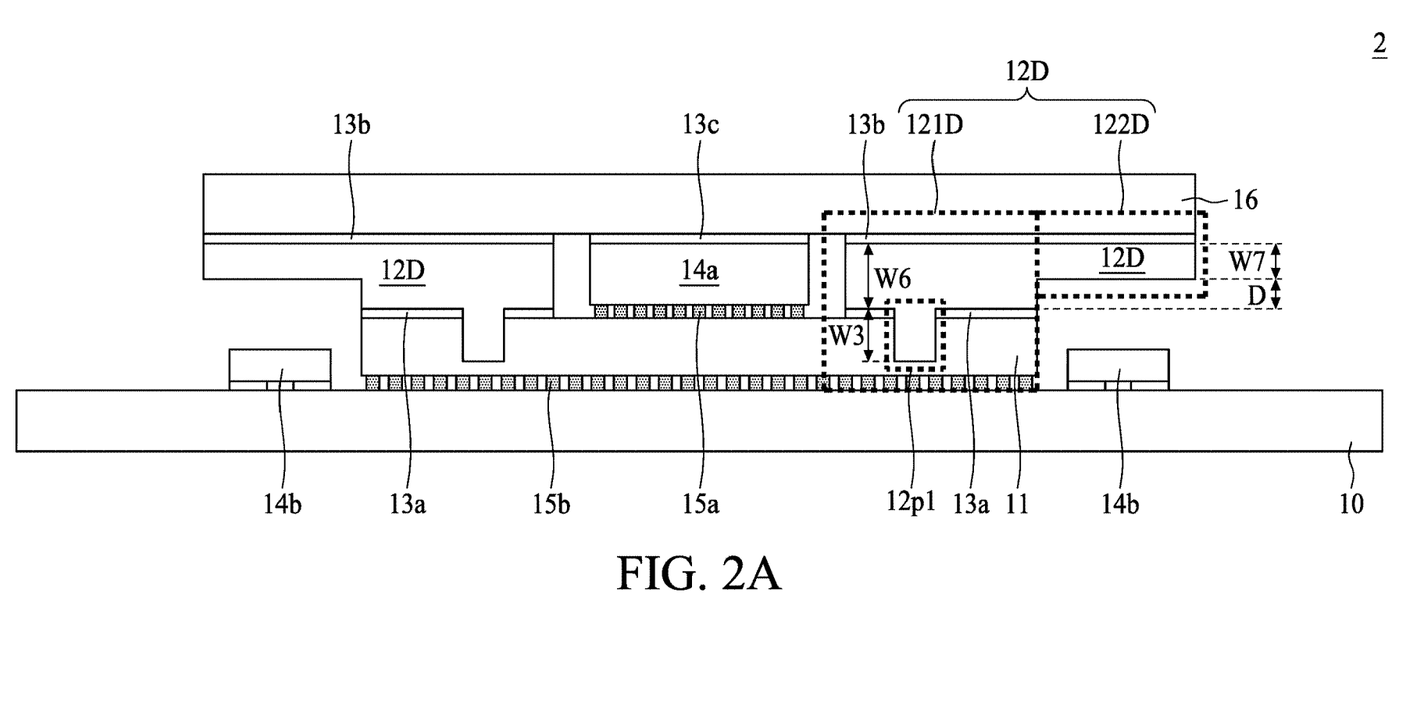
FIG. 2A is a cross-sectional view of another semiconductor device package in accordance with some embodiments of the present disclosure.

FIG. 2A is a cross-sectional view of another semiconductor device package 2 in accordance with some embodiments of the present disclosure. The semiconductor device package 2 is similar to the semiconductor device package 1, and the differences therebetween are described below.

The supporting structure 12D includes two portions 121D and 122D. The portion 121D includes the pin portion 12p1. The thickness W6 of the portion 121D may be different from the thickness W7 of the portion 122D. The thickness W7 of the portion 122D may be smaller than the thickness W6 of the portion 121D. The length of the supporting structure 12D is greater than the length of the substrate 11. Therefore, a large space under the portion 122D may be provided to accommodate the electronic components 14b on the carrier 10. Furthermore, the weight of the supporting structure 12D may be reduced.

The length L3 of the heat spreading structure 16 is greater than the length L1 of the substrate 11 but smaller than three times of the length L1 of the substrate 11. The length L2 of the supporting structure 12D is smaller than three times of the length L1 of the substrate 11. The thickness W2 of the heat spreading structure 16 may be arranged at a range of 0.5 mm to 3 mm. There is a distance D to illustrate the difference between the thickness W6 of the portion 121D and the thickness W7 of the portion 122D. The length L3 of the heat spreading structure 16 may be smaller than 100 times of the difference between the distance D and thickness W2 of the heat spreading structure 16.

Figure 2B:
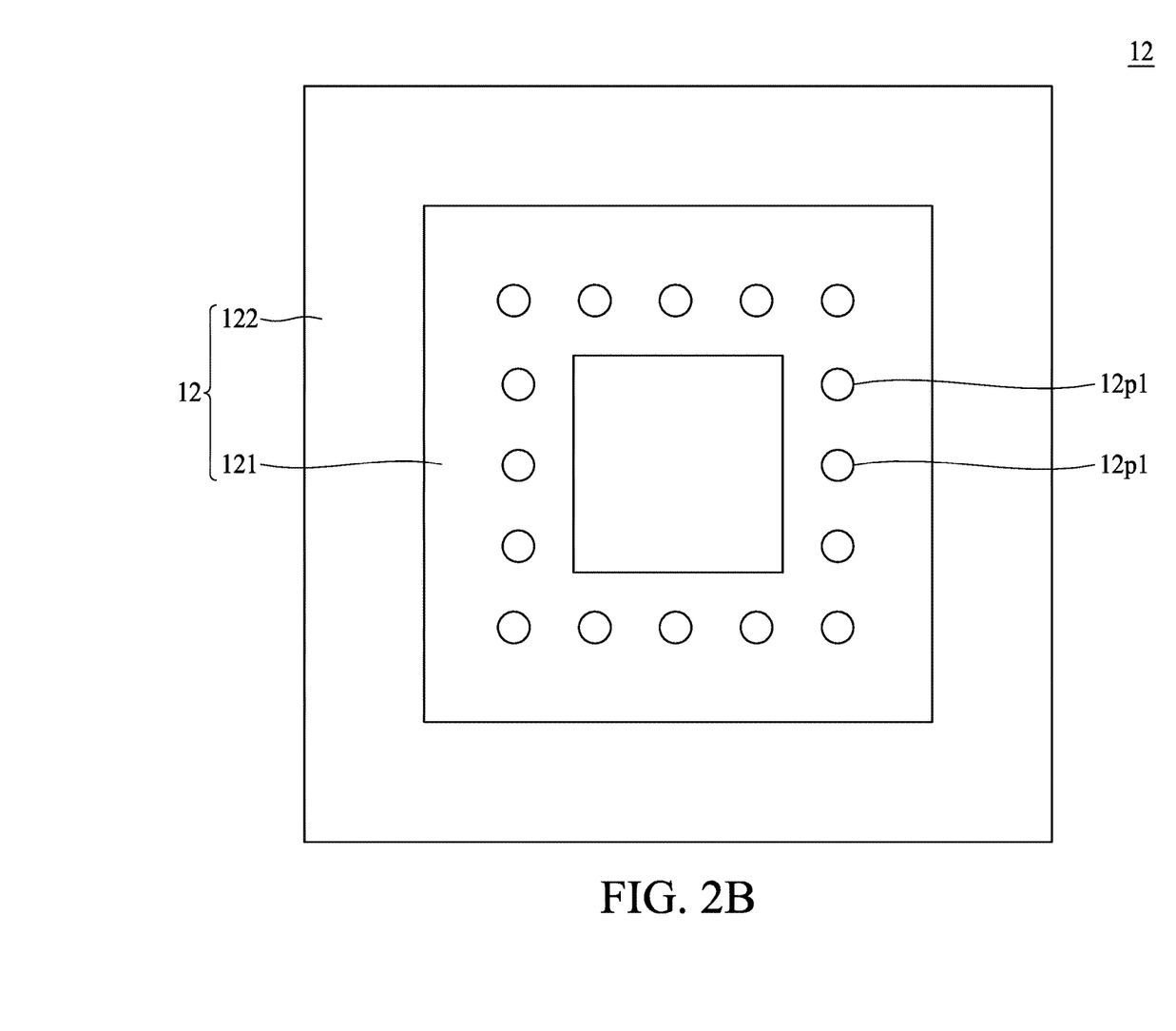
FIG. 2B is a top view of a supporting structure of the semiconductor device package in accordance with some embodiments of the present disclosure.

FIG. 2B is a top view of the supporting structure 12D of the semiconductor device package in accordance with some embodiments of the present disclosure. The supporting structure 12D includes two portions 121D and 122D. The portion 121D is surrounded or encircled by the portion 122D. The portion 121D may have a rectangle or a rectangle-like profile or a square ring. The portion 122D may have a rectangle or a rectangle-like profile or a square ring.

The electronic component 14a may be located at the central region encircled by the portion 121D. The electronic component 14b may be located under the region 122D. The pin portions 12p1 are formed within the portion 121D. The positions of the pin portions 12p1 are arranged in a rectangle or a rectangle-like profile. The pin portions 12p1 encircle or surround the electronic component 14a. A thickness of the portion 121D is greater than a thickness of the portion 122D.

Figure 3A:
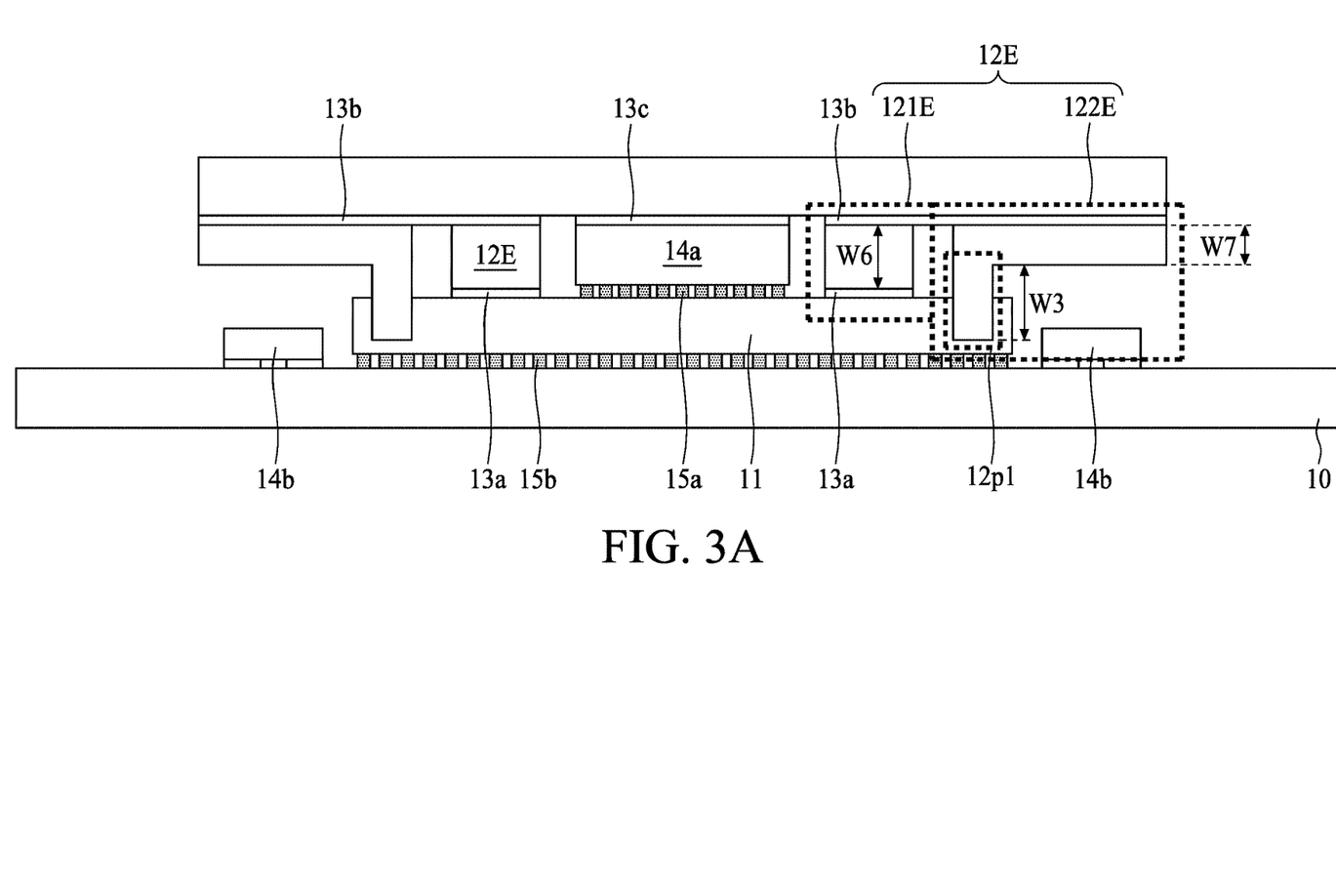
FIG. 3A and FIG. 3B are cross-sectional views of a semiconductor device package in accordance with some embodiments of the present disclosure.

FIG. 3A is a cross-sectional view of a semiconductor device package 3 in accordance with some embodiments of the present disclosure. The semiconductor device package 3 is similar to the semiconductor device package 2, and the differences therebetween are described below. The portion 121E is connected to the substrate 11 by the adhesive layer 13a. The portion 122E includes a pin portion 12p1. The portion 122E is connected to the substrate 11 by the pin portion 12p1 without forming an adhesive layer. The portion 121E is separated apart from the portion 122E. An air gap may be formed between the portions 121E and 122E to achieve heat spreading.

The thickness W6 of the portion 121E is different from the thickness W7 of the portion 122E. The thickness W7 of the portion 122E may be smaller than the thickness W6 of the portion 121E. Therefore, a large space under the portion 122E may be provided to accommodate the electronic components 14b on the carrier 10. Furthermore, the weight of the supporting structure 12E may be reduced.

Figure 3B:
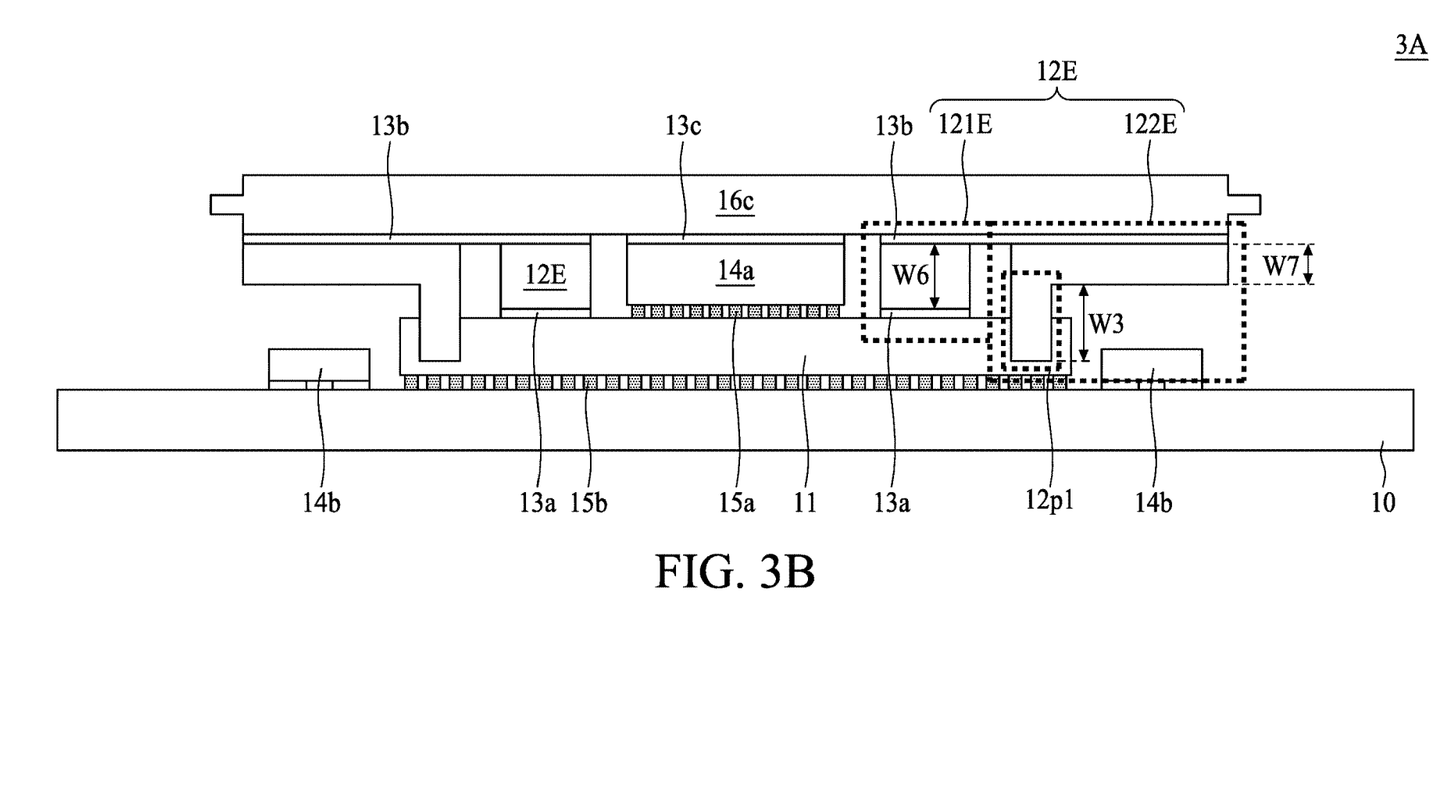

FIG. 3B is another cross-sectional view of the semiconductor device package 3A in accordance with some embodiments of the present disclosure. The semiconductor device package 3A is similar to the semiconductor device package 3, and the differences therebetween are described below.

The heat spreading structure 16 further includes a vapor chamber 16C. The heat spreading structure 16 is envisioned to be constructed using heat-conducting material with vapor chambers or heat pipes, for example, inside of the base, and the like. Therefore, the heat spreading structure 16 may spread or dissipate heat generated by the electronic components 14a and 14b.

Figure 3C:
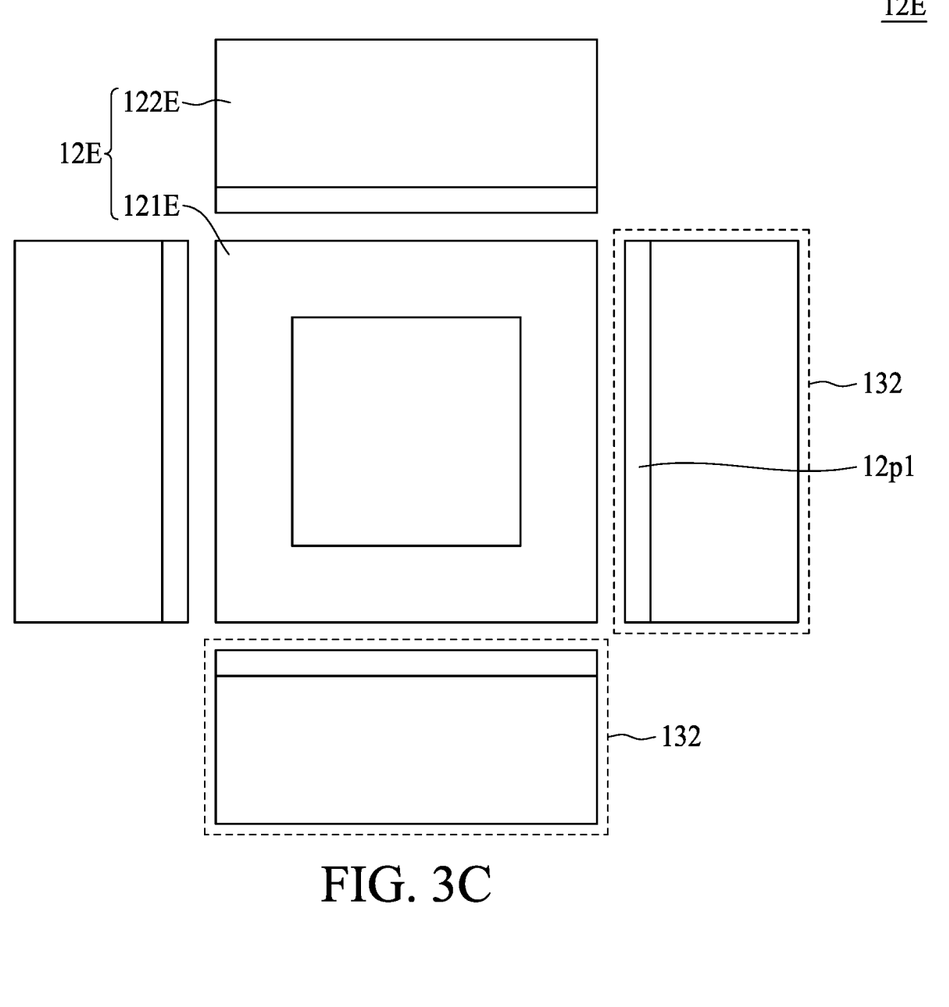
FIG. 3C is a top view of a supporting structure of the semiconductor device package in accordance with some embodiments of the present disclosure.

FIG. 3C is a top view of the supporting structure 12E of the semiconductor device package 1 in accordance with some embodiments of the present disclosure. The supporting structure 12E includes two portions 121E and 122E. The portion 121E may have a rectangle or a rectangle-like profile or a square ring. The electronic component 14a may be located at the central region encircled by the portion 121E.

The pin portions 12p1 are formed within the portion 122E rather than the portion 121E. The pin portions 12p1 may have a strip or a strip-like profile. The pin portions 12p1 encircle or surround the electronic component 14a. The portion 122E includes several auxiliary portions 132. The auxiliary portions 132 extend from four sides of the region 121E. The portion 121E is separated apart from the portion 122E. A thickness of the portion 121E is greater than a thickness of the portion 122E.

Spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The terms "approximately," "substantially," "substantial" and "about" are used herein to describe and account for small variations. When used in conjunction with an event or circumstance, the terms may refer to instances in which the event or circumstance occurs precisely, as well as instances in which the event or circumstance occurs to a close approximation. As used herein with respect to a given value or range, the term "about" generally means within ±10%, ±5%, ±1%, or ±0.5% of the given value or range. Ranges may be expressed herein as being from one endpoint to another endpoint or between two endpoints. All ranges disclosed herein are inclusive of the endpoints, unless specified otherwise. The term "substantially coplanar" may refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term may refer to the values lying within ±10%, ±5%, ±1%, or ±0.5% of an average of the values.

The foregoing outlines the features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

The invention claimed is:

1. A semiconductor device package, comprising:
   a substrate;
   an electronic component disposed on the substrate;
   a supporting structure disposed on the substrate and surrounding the electronic component; and
   a heat spreading structure disposed on the supporting structure, wherein a length of the supporting structure and a length of the heat spreading structure are greater than a length of the substrate,
   wherein the supporting structure further comprises a first pin portion extending from a bottom surface of the supporting structure into the substrate.

2. The semiconductor device package as claimed in claim 1, wherein the length of the heat spreading structure is smaller than three times of the length of the substrate.

3. The semiconductor device package as claimed in claim 1, wherein the supporting structure further comprises a second pin portion extending from a top surface of the supporting structure into the heat spreading structure.

4. The semiconductor device package as claimed in claim 1, wherein a depth of the first pin portion is greater than half of a thickness of the substrate.

5. The semiconductor device package as claimed in claim 1, wherein the heat spreading structure is connected to a top surface of the supporting structure by a first adhesive layer; the substrate is connected to a bottom surface of the supporting structure by a second adhesive layer, and a material of the first adhesive layer is the same as a material of the second adhesive layer.

6. The semiconductor device package as claimed in claim 5, wherein the heat spreading structure is connected to a backside surface of the electronic component by a third adhesive layer, and a material of the third adhesive layer is the same as the material of the first adhesive layer and the second adhesive layer.

7. The semiconductor device package as claimed in claim 1, wherein the supporting structure has a rectangular profile to encircle the electronic component.

8. The semiconductor device package as claimed in claim 7, wherein the supporting structure has a first portion and a second portion surrounding the first portion; the first portion has a rectangular profile, and the second portion comprises four prolonging portions extending from four corners of the first portion.

9. The semiconductor device package as claimed in claim 1, wherein the electronic component is attached to a top surface of the substrate by a plurality of conducting elements.

10. The semiconductor device package as claimed in claim 1, wherein the first pin portion has a cone profile.

11. A semiconductor device package, comprising:
a substrate;
a first electronic component disposed on the substrate;
a supporting structure surrounding the first electronic component, the supporting structure having a first portion over the substrate and a second portion extending laterally beyond a lateral surface of the substrate; and
a heat spreading structure covering the first electronic component and the supporting structure,
wherein the supporting structure further comprises a first pin portion extending from a bottom surface of the first portion into the substrate.

12. The semiconductor device package as claimed in claim 11, wherein a length of the supporting structure and a length of the heat spreading structure are greater than a length of the substrate.

13. The semiconductor device package as claimed in claim 11, wherein a thickness of the first portion of the supporting structure is greater than a thickness of the second portion of the supporting structure.

14. The semiconductor device package as claimed in claim 11, wherein the first portion of the supporting structure has a rectangular profile, and the second portion of the supporting structure comprises four prolonging portions extending from four corners of the first portion.

15. The semiconductor device package as claimed in claim 11, wherein the first electronic component is attached to a top surface of the substrate by a plurality of conducting elements.

16. The semiconductor device package as claimed in claim 11, wherein the first portion and the second portion of the supporting structure have a rectangle profile.

17. The semiconductor device package as claimed in claim 11, wherein the first pin portion has a cone profile.

18. The semiconductor device package as claimed in claim 17, wherein the supporting structure further comprises a second pin portion extending from a top surface of the supporting structure into the heat spreading structure.

* * * * *